US006759804B2

United States Patent
Ellens et al.

(10) Patent No.: US 6,759,804 B2
(45) Date of Patent: Jul. 6, 2004

(54) ILLUMINATION DEVICE WITH AT LEAST ONE LED AS LIGHT SOURCE

(75) Inventors: Andries Ellens, Den Haag (NL); Günter Huber, Schrobenhausen (DE); Robert Mc Sweeney, Sayre, PA (US)

(73) Assignee: Patent-Treuhand-Gesellschaft für Elektrische Glühlampen mbH, München (DE)

(*) Notice: Subject to any disclaimer, the term of this patent is extended or adjusted under 35 U.S.C. 154(b) by 110 days.

(21) Appl. No.: 10/242,844

(22) Filed: Sep. 12, 2002

(65) Prior Publication Data

US 2003/0057829 A1 Mar. 27, 2003

(30) Foreign Application Priority Data

Sep. 27, 2001 (DE) ........................ 201 15 914 U

(51) Int. Cl.[7] .................. H01L 33/00; H05B 33/40
(52) U.S. Cl. .................. 313/512; 313/503; 313/502; 313/501; 257/99; 362/800
(58) Field of Search .................. 313/499, 506, 313/501–503, 512; 257/88, 97–99; 362/260, 310, 362, 800

(56) References Cited

U.S. PATENT DOCUMENTS 3,513,103 A    5/1970 Shaffer
5,535,230 A    7/1996 Abe
5,838,101 A    11/1998 Pappalardo
5,998,925 A    12/1999 Shimizu et al.
6,351,069 B1 * 2/2002 Lowery et al. ............ 313/512
6,488,392 B1 * 12/2002 Lu ........................... 362/308
6,504,179 B1 * 1/2003 Ellens et al. ................ 257/88
6,670,748 B2 * 12/2003 Ellens et al. ............... 313/503

FOREIGN PATENT DOCUMENTS

| DE | 201 08 013 U 1 | 9/2001 |
| DE | 100 26 435 A1 | 4/2002 |
| WO | WO 97/48138 | 12/1997 |
| WO | WO 98/12757 | 3/1998 |
| WO | WO 00/33390 | 6/2000 |

* cited by examiner

Primary Examiner—Ashok Patel
(74) Attorney, Agent, or Firm—Frishauf, Holtz, Goodman & Chick, P.C.

(57) ABSTRACT

Illumination device with at least one LED as light source, the LED emitting primary radiation in the range from 380 to 420 nm, this radiation being partially or completely converted into longer-wave radiation by phosphors which are exposed to the primary radiation from the LED, the conversion taking place at least with the aid of a phosphor which emits over a broad band and originates from the class of the (Eu,Mn)-coactivated halophosphates, the cation M representing one of the metals Sr, Ca, Ba.

17 Claims, 6 Drawing Sheets

ILLUMINATION DEVICE WITH AT LEAST ONE LED AS LIGHT SOURCE

TECHNICAL FIELD

The invention is based on an illumination device with at least one LED as light source in accordance with the preamble of claim 1. It deals in particular with an LED which emits in the visible or white region and is based on an LED which emits primarily UV/blue light.

BACKGROUND ART

An illumination device with at least one LED as light source which emits, for example, white light is currently produced predominantly by combining a Ga(In)N LED which emits in the blue region at approximately 460 nm and a yellow-emitting YAG:$Ce^{3+}$ phosphor (U.S. Pat. Ser. No. 5,998,925 and WO 98/12757).

A more complex concept with improved color rendering is a three-color mixture. In this case, the fundamental colors red-green-blue (RGB) are mixed to produce white. In this context, it is either possible to use a blue LED for partial conversion of two phosphors which emit red and green (WO 00/33390) or to use a UV-emitting LED which excites three phosphors, which respectively emit in the red, green and blue (cf. WO 97/48138). Examples are line emitters, such as YOB:Ce,Tb (green) and YOS:Eu (red). In this case, however, a relatively short-wave emission (UV region<370 nm) is required in order to be able to achieve high quantum efficiencies. This requires the use of sapphire substrates for the UV LED, which are very expensive. On the other hand, if a UV LED based on the less expensive SiC subtrates is used, one has to be satisfied with an emission in the range from 380 to 420 nm, which makes the use of line emitters in the green and red difficult to impossible. In the case of blue phosphors, this leads to absorption problems.

Furthermore, a specific problem in this context is the additional absorption loss of blue radiation on account of the broad-banded nature of the absorption of the red- and green-emitting phosphors. All this together leads to considerable limitations when setting the luminous color and light efficiency.

U.S. Pat. No. 5,535,230 has disclosed the use of ordinary "calcium halophosphate" for semiconductor components or fluorescent lamps. This term is understood as meaning the commercially available $Ca_5(PO_4)_3Cl:(Sb,Mn)$, as discussed in detail, for example, in U.S. Pat. No. 5,838,101. A further halophosphate discussed in that document is $(Sr,Ba,Ca)_5(PO_4)_3Cl:Eu$. In this context, these phosphors are used for excitation by the far UV (254 nm).

Finally, U.S. Pat. No. 3,513,103 proposes the use of $(Sr,Ca)_9(PO_4)_6Cl_2:(Eu,Mn)$ in fluorescent lamps for conversion of the UV radiation.

DISCLOSURE OF THE INVENTION

It is an object of the present invention to provide an illumination device with at least one LED as light source, the LED emitting primary radiation in the range from 380 to 420 nm, this radiation being partially or completely converted into longer-wave radiation by phosphors which are exposed to the primary radiation from the LED, which is distinguished by high stability. A further object is to provide an illumination device which emits white light and in particular has a high color rendering. A further object is to provide a high-efficiency LED which absorbs well in the range from 380 to 420 nm and is easy to produce.

This object is achieved by the following features: the conversion is achieved at least with the aid of a phosphor which emits over a broad band and originates from the class of the (Eu,Mn)-coactivated halophosphates, the halophosphate corresponding to the formula $M_5(PO_4)_3(Cl,F):(Eu^{2+},Mn^{2+})$, where M=Sr, Ca, Ba individually or in combination. Particularly advantageous configurations are given in the dependent claims.

High-efficiency phosphors which emit red light and are suitable for LEDs which emit primarily in the near UV are rare. The term near UV is in this context intended to cover wavelengths between approximately 380 and 420 nm. By way of example, the line emitter $Ln_2O_2S:Eu^{3+}$ (Ln=La, Y, Gd, Lu) is suitable for use with UV LEDs with primary emission below 380 nm. Hitherto, only Eu-doped nitrides or sulfides have been serious candidates for wavelengths above 380 nm. However, nitrides, which are sensitive to air, are difficult to produce. Sulfides have two drawbacks: they have an absorption gap between 380 and 410 nm and they are not particularly stable, i.e. are temperature-sensitive. Organic phosphors are too sensitive for LED applications. Virtually all known oxides have a low absorption at wavelengths greater than 380 nm.

According to the invention, the phosphor used for the LED-based illumination device is a halophosphate of type $(Sr,Ba,Ca)_5(PO_4)_3(Cl,F):(Eu,Mn)$. The same halophosphate, but activated only with Eu, is well known as a blue-emitting phosphor for fluorescent lamps and is commercially available. It has very good absorption at 254 and 365 nm. However, its absorption in the near UV (380 to 420 nm) is unsatisfactory. Quite unexpectedly, it has been found that adding the coactivator Mn hugely increases the absorption in the desired region without the efficiency suffering significantly.

In particular, it has been found that adding a melting agent in a high concentration ($SrCl_2$) and the use of a relatively high level of Eu are favorable. Furthermore, a high level of purity and a small grain size of the raw materials should be ensured. Then, depending on the concentration of the activators Eu and Mn, a yellow to red emission results. The Eu content based on the divalent cation is preferably 0.5 to 2 mol %, and the Mn content, based on the divalent cation, is 3 to 8 mol %. The cation used is primarily Sr, if appropriate with a small amount of added Ba and/or Ca. The Mn:Eu ratio should be approximately 4 to 8.

Overall, therefore, it is possible to achieve highly efficient conversion of primary radiation in the range from 380 to 420 nm, since this excitation range is close to the emission of the phosphor.

In addition to producing a colored light source by excitation by means of UV radiation or blue primary emission from an LED (380 to 420 nm), it is advantageous in particular to generate white light with the aid of this phosphor. In the case of a UV-emitting LED as primary light source, this is achieved using at least two phosphors. In this way, it is possible to achieve good color rendering of over Ra=75. The point is that the phosphor according to the invention itself simultaneously provides two emission peaks in the blue and the yellow-red spectral regions, and therefore achieves something which normally requires two different phosphors.

This phosphor can be used together with other phosphors to achieve a white-emitting LED. It is particularly preferable for it to be used together with chlorosilicate phosphors as are already known per se. In this context, see for example WO 01/95400, corresponding to U.S. Ser. No. 10/048,963 and WO 01/93342, corresponding to U.S. Ser. No. 10/031,578, to which reference is expressly made. Therefore, the white point can be hit almost exactly given a suitable mixture.

A white mixture can also be produced on the basis of a UV-emitting LED by means of this (Eu,Mn)-doped halophosphate together with a blue-green phosphor, such as for example $BaMgAl_{10}O_{17}:Eu^{2+}$ (BAM). If necessary, the color rendering can be improved still further by adding a green phosphor (for example Eu-doped thiogallates or chlorosilicates or Sr aluminate).

BRIEF DESCRIPTION OF THE DRAWINGS

In the text which follows, the invention is to be explained in more detail with reference to a plurality of exemplary embodiments. In the drawing.

BEST MODE FOR CARRYING OUT THE INVENTION

Figure 1A:
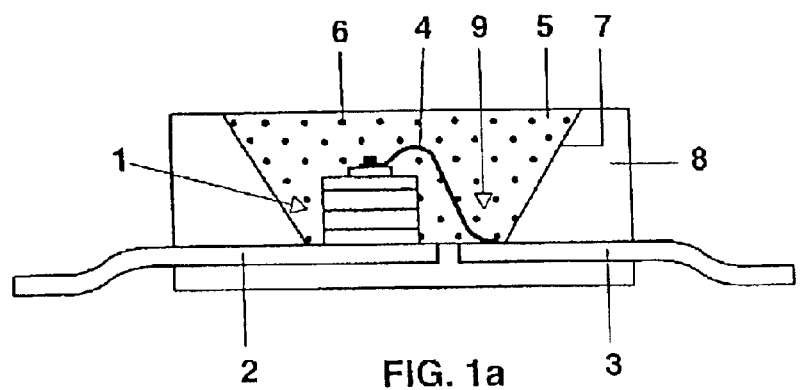
FIGS. 1a and 1b shows a semiconductor component which serves as light source (LED) for white light, with (FIG. 1a) and without (FIG. 1b) casting resin.

By way of example, a structure similar to that used in U.S. Pat. No. 5,998,925 is described for use in a white LED together with an InGaN chip. The structure of a light source of this type for white light is specifically shown in FIG. 1a. The light source is a semiconductor component (chip 1) of type InGaN with a peak emission wavelength of 400 nm, having a first and a second electrical connection 2,3, which is embedded in an opaque base housing 8 in the region of a recess 9. One of the connections 3 is connected to the chip 1 via a bonding wire 4. The recess has a wall 7 which serves as reflector for the blue primary radiation of the chip 1. The recess 9 is filled with a potting compound 5 which as its main constituents contains a silicone casting resin (or epoxy casting resin) (80 to 90% by weight) and phosphor pigments 6 (less than 15% by weight). There are also further small amounts of, inter alia, methyl ether and Aerosil. The phosphor pigments are a mixture of two (or more) pigments which emit blue and yellow light.

Figure 1B:
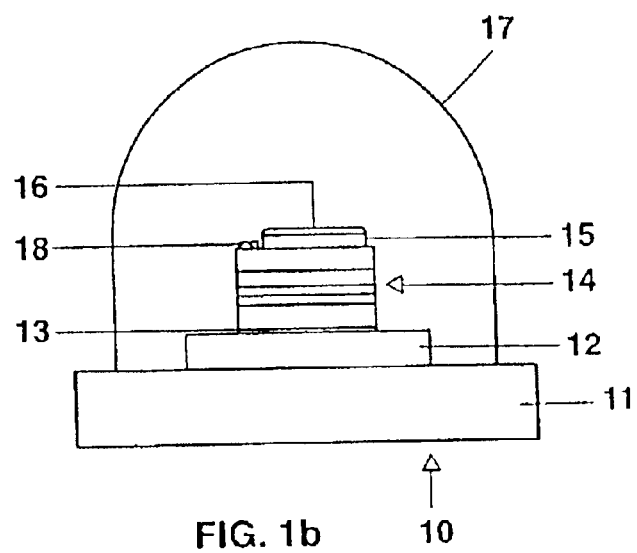

FIG. 1b shows an exemplary embodiment of a semiconductor component 10 in which the conversion into white light is effected by means of conversion layers 16 which are applied directly to the individual chip. On top of a substrate 11 there are a contact layer 12, a mirror 13, an LED 14, a filter 15 and a phosphor layer 16, which can be excited by the primary radiation, for conversion into visible long-wave radiation. This structural unit is surrounded by a plastic lens 17. Only the upper contact 18 of the two ohmic contacts is illustrated.

Figure 2:
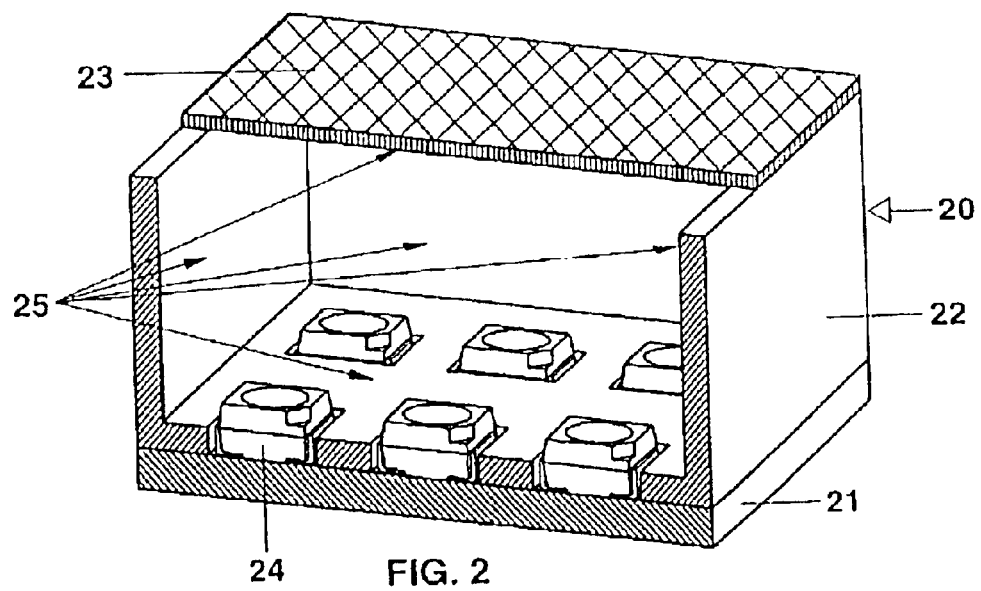
FIG. 2 shows an illumination device with phosphors in accordance with the present invention.

FIG. 2 shows part of a surface-lighting fitting 20 as illumination device. It comprises a common support 21, to which a cuboidal outer housing 22 is adhesively bonded. Its upper side is provided with a common cover 23. The cuboidal housing has cutouts in which individual semiconductor components 24 are accommodated. They are UV-emitting light-emitting diodes with a peak emission of 380 nm. The conversion into white light takes place by means of conversion layers 25 which are arranged on all the surfaces which are accessible to the UV radiation. These include the inner surfaces of the side walls of the housing, of the cover and of the base part. The conversion layers 25 consist of phosphors which emit in the red, green and blue spectral regions using the phosphors according to the invention.

In a preferred exemplary embodiment, these are predominantly Sr halophosphates, in which a proportion of the divalent cation Sr amounting to between 1 and 40 mol % has been replaced by Ca or Ba. Typical quantum efficiencies of these phosphors are 50 to 80%.

Figure 3A:
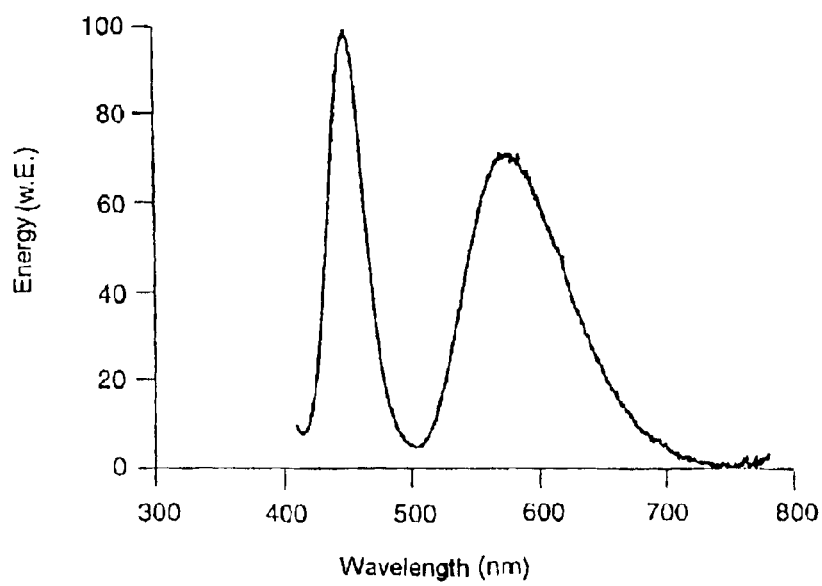
FIGS. 3a and 3b shows the emission spectrum and reflection spectrum of a phosphor in accordance with the present invention.

FIG. 3 shows the emission and the reflection characteristics of a preferred halophosphate as a function of the wavelength.

Figure 3B:
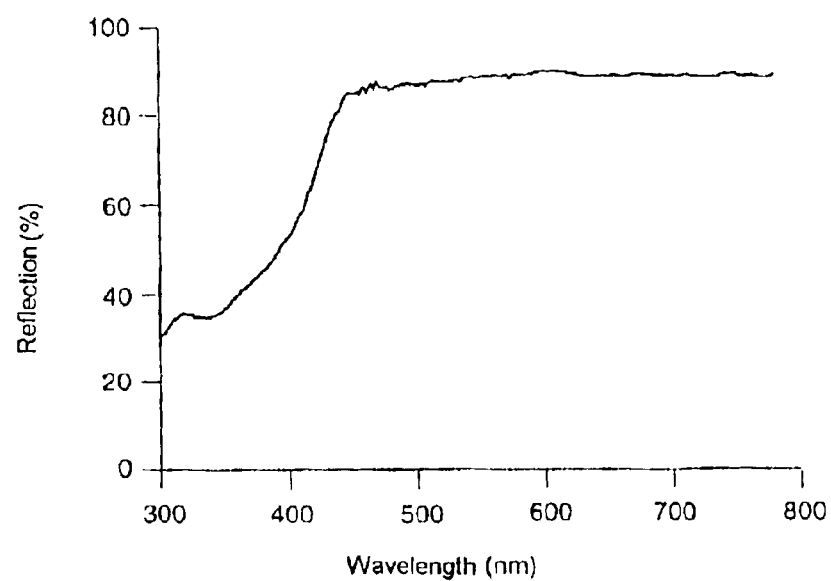

In detail, FIG. 3 shows the emission spectrum of the halophosphate $Sr_5(PO_4)_3Cl:(Eu^{2+},Mn^{2+})$ with the precise composition $Sr_{4.65}Eu_{0.05}Mn_{0.3}(PO_4)_3Cl$, test number KF 725. The maximum lies at 448 nm, and the mean wavelength at 545 nm. The quantum efficiency QE is 54%. The reflection (FIG. 3b) at 400 nm is approximately R400=54% and at 430 nm is approximately R430=77%. In this case, therefore, the Eu forms approximately 1 mol % of the cation Sr, and the Mn forms approximately 6 mol % of this cation. The Mn/Eu ratio is 6:1, and the color locus lies at x=0.352; y=0.300.

The synthesis of the halophosphate KF 725 is described in more detail below by way of example. As part of the synthesis, deviations of up to 3% from the precise stoichiometry may occur for these weighed-in phosphors in the charge.

The phosphor powder is produced by a high-temperature solid-state reaction. For this purpose, by way of example the high-purity starting materials $SrHPO_4$, $SrCO_3$, $MnCO_3$, $Eu_2O_3$ and $NH_4Cl$ are mixed together in the dry state, with a molar ratio of 150:80:15:1.25:60.

After the individual components have been thoroughly mixed, the powder is heated at approx. 1100° C. for 1–2 h in forming gas (5% $H_2$) and is thereby reacted to form the compound referred to above. It is milled with the addition of further $NH_4Cl$. The second anneal takes place under similar conditions to the first anneal. After pulverizing for 1 h, the phosphor is washed and dried. A yellowish powder is formed. The phosphor has a narrow $Eu^{2+}$ band at 445 nm and a broad Mn band at 575 nm. The intensity ratio is regulated by the Mn content. The color locus is x=0.340; y=0.280.

Figure 4:
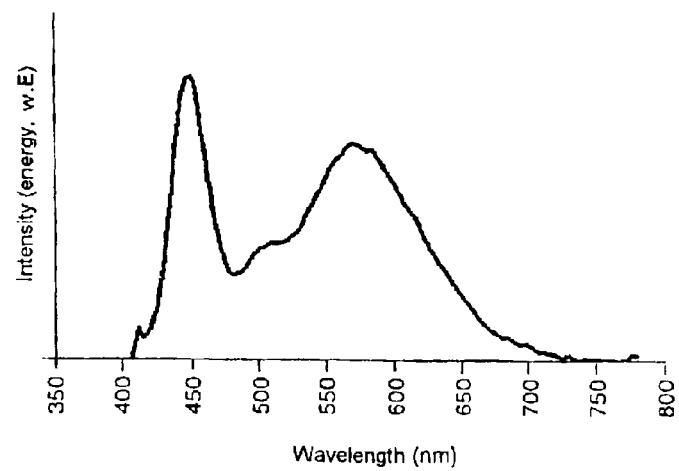
FIGS. 4 and 5 show the emission spectrum of an LED with the phosphors halophosphate and chlorosilicate in accordance with the present invention.

FIG. 4 shows the emission spectrum of a luminescence conversion LED (lucoled) based on a blue InGaN LED with primary emission at 380 nm using a mixture of halophosphate:Eu,Mn and a chlorosilicate. This is KF 725 together with $Ca_{7.6}Eu_{0.4}Mg(SiO_4)_4Cl_2$. In this case, the color rendering is Ra=78. The quantum efficiency QE is 76%. This mixture of an Sr halophosphate together with Eu-doped chlorosilicate hits the white point almost exactly. The color locus is x=0.332; y=0.332 when a suitable mixing ratio is selected.

Figure 5:
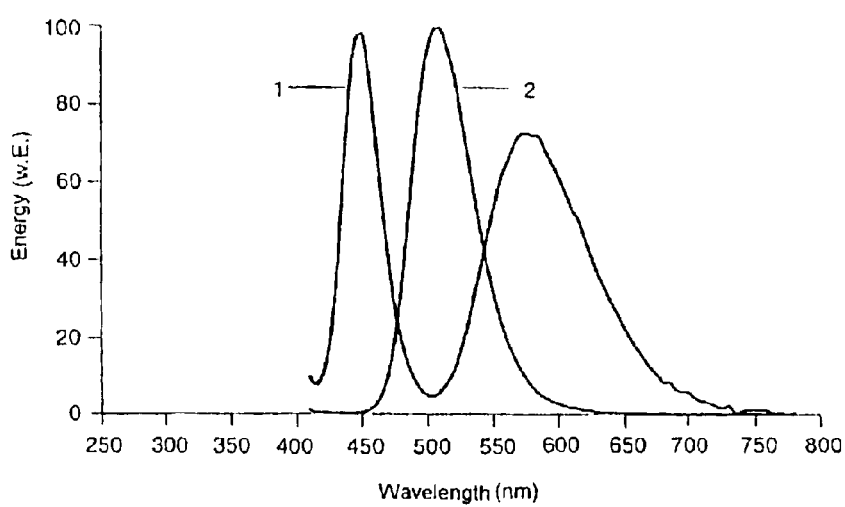

FIG. 5 shows the individual components from FIG. 4. In this case, the halophosphate is designated curve 1, while the chlorosilicate is designated curve 2.

Depending on the precise stoichiometry selected, SCAP: (Eu,Mn) can be combined with various phosphors which in particular emit green light (such as chlorosilicate) or yellow light (such as YAG:Ce).

A particular advantage of the phosphor according to the invention is its broad-banded emission, specifically that two emission peaks can be produced by means of a single phosphor. By varying the Eu/Mn ratio, it is possible to set the emission as desired and to achieve the desired color locus. The Mn:Eu ratio should in particular be selected to be between 4 and 8.

The phosphor according to the invention is highly stable, has a high-temperature fluorescent extinction and moreover is easy to produce.

If a long-wave primary radiation (in particular 410 to 420 nm) is used, the primary radiation may itself also contribute a small amount of blue to the overall emission.

FIGS. 6a to 8b show further examples of phosphors according to the invention. When these phosphors are weighed into the batch, a substantially precise stoichiometry is used, but with chlorine and/or fluorine being used in excess, which serves to compensate for chloride or fluoride which evaporates.

Figure 6A:
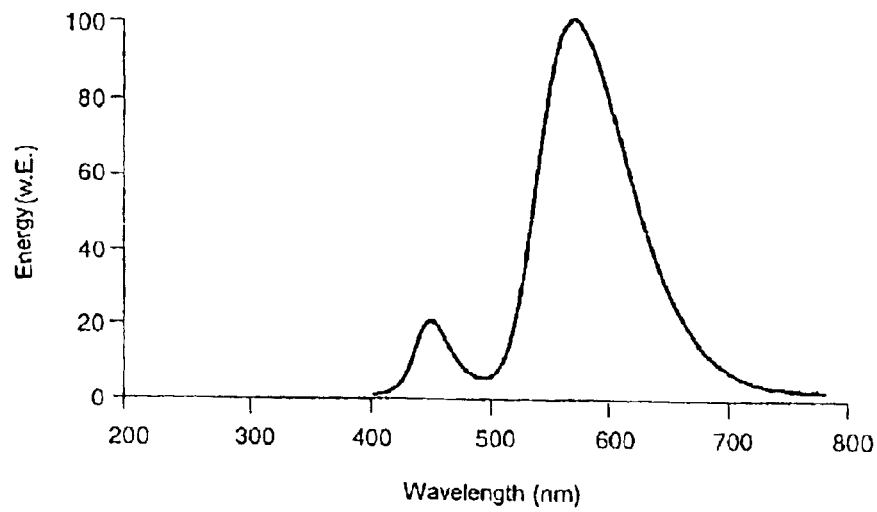
FIGS. 6a to 8b show the emission spectrum and reflection spectrum of further phosphors in accordance with the present invention.
Figure 6B:
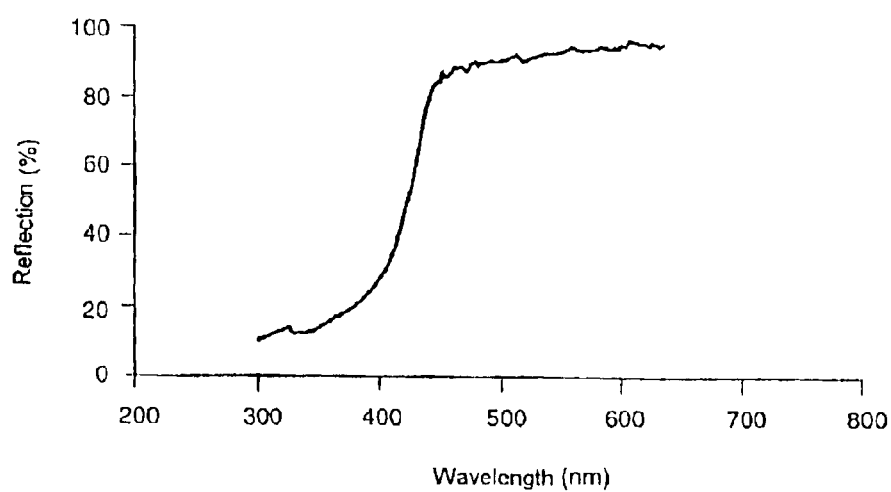

FIGS. 6a and 6b show the emission and reflection spectrum of an (Eu,Mn)-codoped phosphor $Sr_{3.93}Eu_{0.48}Mn_{0.59}(PO_4)_3Cl$ with emission maxima at 450 and 574 nm, a color locus x=0.459 and y=0.455. In this case, the peak ratio is approximately 5:1 in favor of the longer-wave peak.

Figure 7A:
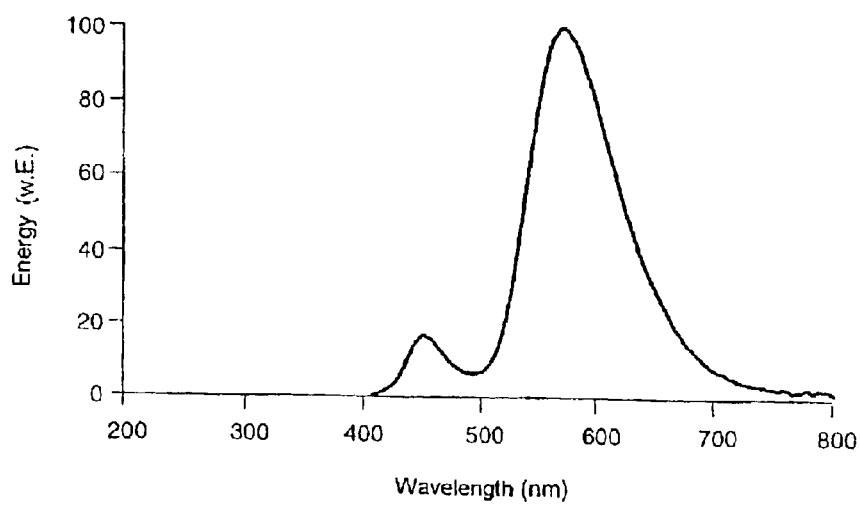
Figure 7B:
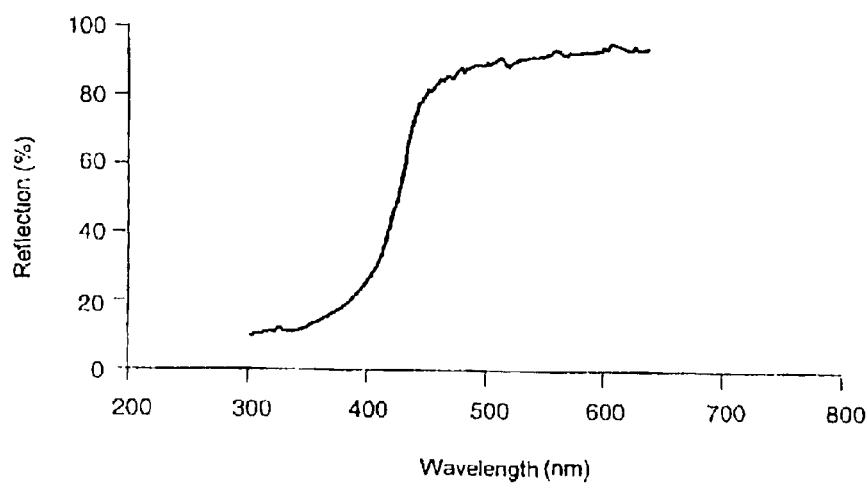

FIGS. 7a and 7b show the emission and reflection spectrum of an Eu,Mn-codoped phosphor $Sr_{3.93}Eu_{0.48}Mn_{0.59}(PO_4)_3(Cl_{0.84}F_{0.16})$ with emission maxima at 452 and 574 nm, a color locus x=0.460 and y=0.459. In this case, the peak ratio is approximately 8:1 in favor of the longer-wave peak.

Figure 8A:
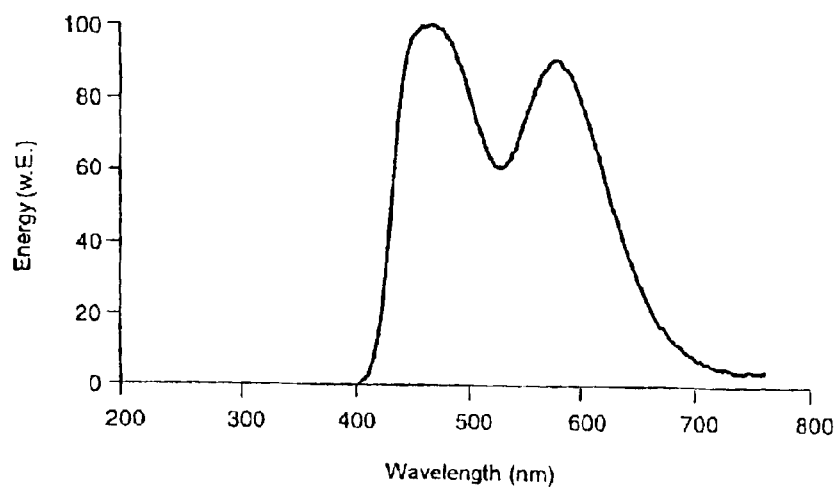
Figure 8B:
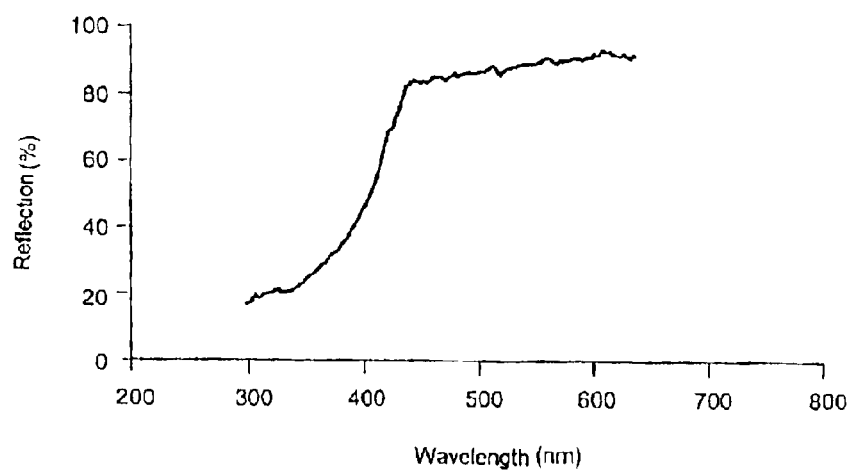

FIGS. 8a and 8b show the emission and reflection spectrum of an Eu,Mn-codoped phosphor, in which M forms a mixture of Sr and Ba. Its formula is $Sr_3Ba_{1.5}Eu_{0.20}Mn_{0.30}(PO_4)_3Cl$ with emission maxima at 470 and 580 nm, a color locus x=0.320 and y=0.336. In this case, the peak ratio is approximately 10:9 in favor of the shorter-wave peak.

The emission and reflection spectrum of an Eu,Mn-codoped phosphor in which M forms a mixture of Sr and Ba, having a formula $Sr_{3.5}Ba_1Eu_{0.20}Mn_{0.30}(PO_4)_3Cl$, has an emission maxima at 451 and 580 nm, a color locus x=0.348 and y=0.334. In this case, the peak ratio of the two emission maxima is approximately 1:1.

These examples show that a wide range of color loci is possible depending on the components selected and their relative proportions.

What is claimed is:

1. An illumination device with at least one LED as light source, the LED emitting primary radiation in the range from 380 to 420 nm, this radiation being partially or completely converted into longer-wave radiation by phosphors which are exposed to the primary radiation from the LED, wherein the conversion is achieved at least with the aid of a phosphor which emits over a broad band and originates from a class of (Eu,Mn)-coactivated halophosphates corresponding to the formula $M_5(PO_4)_3(Cl,F):(Eu^{2+}, Mn^{2+})$, where M is a cation selected from the group consisting of Sr, Ca and Ba individually or in combination; and Cl and F are anions used individually or in combination.

2. The illumination device as claimed in claim 1, wherein the cation is Sr which may be partially (up to 40 mol %) replaced by Ba and/or Ca.

3. The illumination device as claimed in claim 1, wherein the anion is Cl alone, which may be partially (up to 20 mol %) replaced by F.

4. The illumination device as claimed in claim 1, wherein the proportion of Eu amounts to between 0.5 and 10 mol % of the cation M, while the proportion of Mn is between 3 and 12 mol % of the cation M.

5. The illumination device as claimed in claim 1, wherein the Mn:Eu ratio is between 8 and 1, preferably between 1.2 and 6.5.

6. The illumination device as claimed in claim 1, wherein, in order to generate white light, the primary radiation emitted lies in the wavelength range from 380 to 420 nm, the primary radiation emitted being exposed to at least one phosphor as described in one of claims 1 to 5 in order to be converted.

7. The illumination device as claimed in claim 5, wherein the primary radiation, in order to be converted, is exposed to at least one further phosphor which emits in the green (490 to 525 nm) or in the yellow-orange (545 nm to 590 nm) region.

8. The illumination device as claimed in claim 6, wherein the further phosphor is a chlorosilicate or a Y- or Tb-based garnet.

9. The illumination device as claimed in claim 1, wherein, in order to generate colored light, the primary radiation emitted lies in the wavelength range from 380 to 420 nm, the blue radiation which is primarily emitted being exposed to at least one phosphor.

10. The illumination device as claimed in claim 1, wherein a light-emitting diode which emits at short wavelengths and in particular is based on Ga(In)N is used as the primary radiation source.

11. The illumination device as claimed in claim 1, wherein the illumination device is a luminescence conversion LED, in which the phosphors are in direct or indirect contact with the chip.

12. The illumination device as claimed in claim 1, wherein the illumination device is an array of LEDs.

13. The illumination device as claimed in claim 12, wherein at least one of the phosphors is arranged on an optical device arranged in front of the LED array.

14. The illumination device as claimed in claim 2, wherein, in order to generate colored light, the primary radiation emitted lies in the wavelength range from 380 to 420 nm, the blue radiation which is primarily emitted being exposed to at least one phosphor.

15. The illumination device as claimed in claim 3, wherein, in order to generate colored light, the primary radiation emitted lies in the wavelength range from 380 to 420 nm, the blue radiation which is primarily emitted being exposed to at least one phosphor.

16. The illumination device as claimed in claim 4, wherein, in order to generate colored light, the primary radiation emitted lies in the wavelength range from 380 to 420 nm, the blue radiation which is primarily emitted being exposed to at least one phosphor.

17. The illumination device as claimed in claim 5, wherein, in order to generate colored light, the primary radiation emitted lies in the wavelength range from 380 to 420 nm, the blue radiation which is primarily emitted being exposed to at least one phosphor.

* * * * *